United States Patent
Smith et al.

(10) Patent No.: US 9,972,762 B2
(45) Date of Patent: May 15, 2018

(54) THERMOCOUPLE RIBBON AND ASSEMBLY

(71) Applicant: TE WIRE & CABLE LLC, Saddle Brook, NJ (US)

(72) Inventors: Gregory J. Smith, Saddle Brook, CT (US); Mathew J. Nadakal, Morris Plains, NJ (US)

(73) Assignee: TE Wire & Cable LLC, Saddle Brook, NJ (US)

( * ) Notice: Subject to any disclaimer, the term of this patent is extended or adjusted under 35 U.S.C. 154(b) by 366 days.

(21) Appl. No.: 14/016,877

(22) Filed: Sep. 3, 2013

(65) Prior Publication Data

US 2014/0060606 A1 Mar. 6, 2014

Related U.S. Application Data

(60) Provisional application No. 61/695,865, filed on Aug. 31, 2012.

(51) Int. Cl.
| | |
|---|---|
| *H01L 35/08* | (2006.01) |
| *H01L 35/32* | (2006.01) |
| *G01K 7/02* | (2006.01) |
| *G01K 7/10* | (2006.01) |
| *G01K 7/04* | (2006.01) |

(52) U.S. Cl.
CPC ............. *H01L 35/32* (2013.01); *G01K 7/02* (2013.01); *G01K 7/04* (2013.01); *G01K 7/10* (2013.01); *H01L 35/08* (2013.01); *Y10T 156/10* (2015.01)

(58) Field of Classification Search
CPC ........... H01L 35/32; H01L 35/08; G01K 7/02; G01K 7/10
USPC .................................................. 136/233, 225
See application file for complete search history.

(56) References Cited

U.S. PATENT DOCUMENTS

| | | |
|---|---|---|
| 3,607,445 A | 9/1971 | Hines |
| 3,878,728 A | 4/1975 | Marzetta |
| 4,046,009 A | 9/1977 | Sauer |
| 4,419,023 A | 12/1983 | Hager, Jr. |

(Continued)

FOREIGN PATENT DOCUMENTS

| | | | |
|---|---|---|---|
| GB | 1222504 A | * 2/1971 | ............ H01L 35/08 |
| JP | 59-108926 | 6/1984 | |
| JP | 09-137234 | 5/1997 | |
| JP | 2002-062194 | 2/2002 | |
| WO | WO 2009/063515 | 5/2009 | |

OTHER PUBLICATIONS

Dupont Kapton Polyimide film data sheet. Mar. 2012.*

(Continued)

*Primary Examiner* — Lindsey Bernier
(74) *Attorney, Agent, or Firm* — Banner & Witcoff, Ltd.

(57) ABSTRACT

A thermocouple ribbon features a pair of flat conductors and first and second layers of a polyimide film covering the conductors. The polyimide film preferably is coated with a fluoropolymer, such as fluorinated ethylene propylene (FEP). During manufacture of the thermocouple ribbon, the first and second layers of polyimide film, with the pair of flat conductors positioned there between, are heated above the melting temperature of the FEP. The completed thermocouple ribbon is then cooled. A thermocouple connector may then be attached to a first end of the thermocouple ribbon, while a welded thermocouple junction may be formed at a second end of the thermocouple ribbon.

9 Claims, 2 Drawing Sheets

(56) References Cited

U.S. PATENT DOCUMENTS

| | | | |
|---|---|---|---|
| 4,631,350 A | | 12/1986 | Germanton et al. |
| 4,735,661 A | * | 4/1988 | Hollander .............. G01K 1/143 |
| | | | 136/232 |
| 5,370,459 A | | 12/1994 | Culbertson et al. |
| 5,411,600 A | | 5/1995 | Rimai et al. |
| 6,190,040 B1 | | 2/2001 | Renken et al. |
| 6,575,729 B2 | | 6/2003 | Godwin et al. |
| 2003/0209264 A1 | * | 11/2003 | Richetto ................. G01K 7/02 |
| | | | 136/224 |
| 2007/0056624 A1 | | 3/2007 | Gregory et al. |
| 2008/0080591 A1 | | 4/2008 | Tanaka et al. |
| 2010/0074299 A1 | | 3/2010 | Nyffenegger |
| 2011/0277803 A1 | * | 11/2011 | Grande .................. H01L 35/32 |
| | | | 136/225 |

OTHER PUBLICATIONS

Temperature Controls. "Hand held probes thermocouple". 2009. http://www.temperature.com.au/portals/0/file/catalog/page41.pdf.*
English abstract of foreign patent JP 59-108926 dated Jun. 23, 1984, Inventors Yamamoto Toshio et al.
English abstract of foreign patent JP 09-137234 dated May 27, 1997, Inventors Kimura Takeshi et al.
English abstract of foreign patent JP 2002-062194 dated Feb. 28, 2002, Inventor Shida Yusuke.
Section 10: Thermal-Ribbons, Minco Bulletin TS-103, pp. 10-1 through 10-6, www.minco.com.
Surface Sensors RTDs & Thermocouples, SG R Sensors Group Costa Rica S.A. An RdF Company, Surf-R&T Rev—May 2010.

* cited by examiner

THERMOCOUPLE RIBBON AND ASSEMBLY

CLAIM OF PRIORITY

This application claims priority to U.S. Provisional Patent Application No. 61/695,865, filed Aug. 31, 2012, the contents of which are hereby incorporated by reference.

FIELD OF THE INVENTION

The present invention relates generally to thermocouple assemblies and conductors and, in particular, to a generally flat thermocouple ribbon having generally flat conductors and thermocouple assemblies fabricated from such a ribbon.

BACKGROUND

Autoclaves are large ovens used to bake or "heat cure" aerospace parts made out of carbon/fiber composites. Once the parts are "formed," they are installed on holding fixtures and are rolled into the autoclaves for baking. There is also the situation of repairing composite parts that come from an airplane or from composite production lines. Before these parts are placed on the holding fixtures, a vacuum bag is placed to encompass the part to be baked. During the curing process a vacuum is pulled.

In order to monitor temperature of the curing process, thermocouple cables are placed on the parts and the thermocouple cables travel out of and under the vacuum bag. As vacuum is pulled, atmospheric pressure will press the vacuum bags against the part being cured. At curing temperatures, the part will get soft and the compression of the vacuum bag over conventional thermocouple cables will leave an indentation or mark-off, which is unacceptable.

In addition, vacuum seal integrity is required during the manufacturing process of carbon composite components for aircraft. A vacuum is necessary to rid the layered composite assembly of air pockets which cause structural weakness in the assembly, to compress the composite layers to conform to the desired shape, and to increase the fiber-to-resin ration to optimize strength of the composite. Temperature monitoring thermocouples require a vacuum seal since the thermocouple junction is in the vacuum side of the process and the temperature measuring instrumentation is necessarily on the ambient atmosphere side.

Vacuum seals around thermocouples monitoring the temperature of the composite curing process are usually made with pliable compounds or gaskets. To facilitate a successful vacuum tight seal, the gasket material conforms more easily to a flat profile thermocouple wire as opposed to the typical dumb-bell shaped wire pair profile. A need therefore exists for such a cable that reduces or eliminates the possibility of leak path through the space between the conductor and insulating material There are several prior art ribbon cables offered by various sources. None of the prior art ribbon cables, however, are designed with unique features, such as those to address the issues described above, for use in autoclave applications.

DETAILED DESCRIPTION OF EMBODIMENTS

Figure 1:
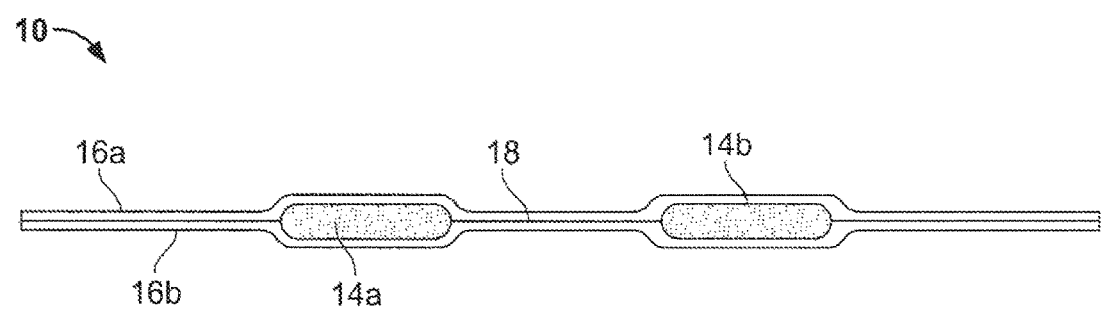
FIG. 1 is a cross sectional view of an embodiment of the thermocouple ribbon conductor of the invention.

As illustrated in FIG. 1, an embodiment of the invention includes a flat thermocouple ribbon, indicated in general at 10, with flat conductors 14a and 14b insulated by thin layers of fluorinated ethylene propylene (FEP) fluoropolymer coated polyimide film 16a and 16b. The flat conductors preferably include pairs of dissimilar alloys such as those alloys used as thermocouple conductors known in the art. The invention is also directed to thermocouple assemblies and devices fabricated from this flat thermocouple ribbon, an example of which is provided in FIG. 2 as described below.

Embodiments of the invention are unique with regard to the following features: (a) Ultra-thin thermocouple ribbon—the preferably 0.012" or less in thickness of the ribbon is four times thinner than equivalent round cables and the flat contour doesn't leave any significant indentations in parts during autoclave applications, and (b) Design and contour prevent leak—due to the nature of the flat conductor (preferably approximately 0.004" thick) and ribbon, and due to the unique material used, the cable prevents leak (ingression of air into the autoclave vacuum), Thermocouple wire and assemblies are used universally to measure temperatures of devices and processes. Typically, the wires used in these applications are round standard gauge wire used in pairs of dissimilar alloys (those alloys used as thermocouple conductors known in the art, for example). The thermocouple pairs are normally insulated with an extruded electrical insulating jacket of a common polymer—FEP, polytetrafluoroethylene (PTFE), silicone or polyvinyl chloride (PVC), to name a few. The extruding process requires a thick wall for the success of the extruding process. Embodiments of the invention significantly reduce the thickness of thermocouple pairs and provides a nearly flat form factor over conventional extruded jacket thermocouple wire.

As indicated above, there are two features that are unique to embodiments of the invention:

Thin Cross Section—embodiments of the invention incorporate a "flat conductor," for example, 0.004" thick on 28 gauge. This thickness is equivalent to 36 gauge, a much smaller gauge and very problematic to use. The combination of a flat conductor and sandwiching of two polyimide tapes helps to achieve the 0.012" thickness. The embodiments of the cable of the present invention, which are preferably 0.012" or less in thickness, spread the force of compression, which eliminates or reduces indentations in parts. This aids in repair of thermally cured composite assemblies where the thermocouple is trimmed and remains in place after the cure, and therefore requires a very small cross-section to maintain structural integrity of the original composite device, and is cosmetically acceptable in appearance after the repair is completed.

Vacuum Seal Integrity—Preferably a 0.004" thick polymide (PI) film that has 0.002" layer of P1 and 0.002" thickness of FEP is used as the insulation or covering of the conductor. PI film (or KAPTON available from E. I. du Pont de Nemours and Company of Wilmington, Del.) is commonly available only in thickness up to 0.002" with FEP coating thickness of 0.0002". This unique tape gives a robust bonding of the two tapes in the manufacturing process. The higher amount of FEP, when melted, seals all possible leak paths.

Therefore, with reference to FIG. 1, in accordance with the invention, flat thermocouple ribbons are fabricated by laminating a pair of flattened thermocouple wires 14a and 14b between two thin layers of polyimide film (preferably 0.004" each layer) 16a and 16b or similar material. The polyimide material is pre-coated on one side with a thin layer (preferably 0.002") 18 of a low melting point polymer (FEP for example). As a result, a sealed, laminated flat thermocouple pair is formed by arranging two parallel thermocouple wires between an upper layer and lower layer of FEP coated polyimide. The assembly is passed through a heat source (hot air, linear furnace, or other source of heat) to increase the temperature of the FEP to its melting point. Upon cooling, the FEP layer solidifies and bonds the assembly together. The result is a ribbon-like, very flat thermocouple wire pair assembly that is as thin as 0.012" and preferably ¼" wide (for a thermocouple with a wire cross-section equivalent to 24 AWG wire—see FIG. 1). Variations of this assembly concept can be manufactured to other dimensions and equivalent AWG wire size, both larger and smaller.

Figure 2:
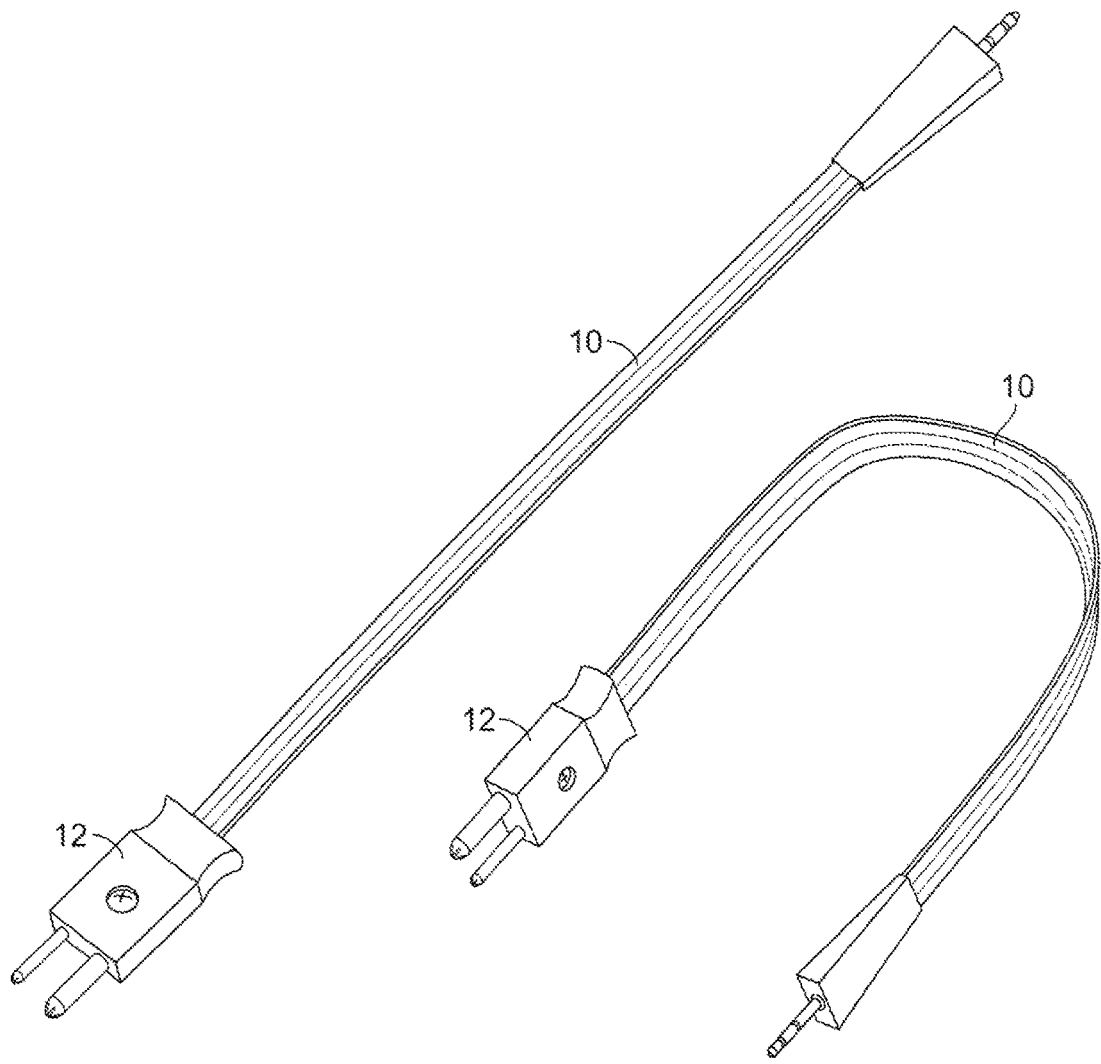
FIG. 2 is a perspective view of a thermocouple ribbon conductor attached to a thermocouple connector in an embodiment of the thermocouple assembly of the invention.

Ready-to-use thermocouple assemblies are fabricated using this thermocouple ribbon. These thermocouple assemblies consisting of a precut length of the flat thermocouple ribbon and include a welded thermocouple junction on one end of the ribbon and a thermocouple connector on the other. As illustrated in FIG. 2, there are many standard thermocouple connectors 12 that are commonly used that can be attached to the ribbon 10, including those mechanically attached and those injection molded to the ribbon wire.

While the preferred embodiments of the invention have been shown and described, it will be apparent to those skilled in the art that changes and modifications may be made therein without departing from the spirit of the invention, the scope of which is defined by the appended claims.

What is claimed is:

1. A thermocouple ribbon comprising:
   a) a pair of flat conductors constructed from a pair of dissimilar alloys, wherein the conductors are flat throughout their entire length, thereby minimizing an overall thickness of the thermocouple ribbon;
   b) an upper layer of polyimide film laminating the pair of flat conductors; and
   c) a lower layer of polyimide film laminating the pair of flat conductors,
   the upper layer and the lower layer of polyimide film each comprising a layer of polyimide and a layer of fluoropolymer, wherein the upper layer and the lower layer of polyimide film provide a vacuum seal integrity along the entire length of the thermocouple ribbon, wherein each layer of fluoropolymer is 2 mils thick in both the upper layer and the lower layer of polyimide film,
   wherein the vacuum seal integrity is created by heating the upper layer and the lower layer of the polyimide film to increase the temperature of each of the layers of fluoropolymer to a melting point of the fluoropolymer, and upon cooling, the layers of fluoropolymer solidify and bond the thermocouple ribbon together,
   wherein the conductors are approximately 4 mils thick and further wherein the overall thickness of the thermocouple ribbon is approximately 12 mils.

2. The thermocouple ribbon of claim 1 wherein the fluoropolymer is fluorinated ethylene propylene.

3. The thermocouple ribbon of claim 2 wherein each layer of polyimide is approximately 2 mils thick.

4. The thermocouple ribbon of claim 1 wherein a width of the thermocouple ribbon is approximately 0.25 inches or less.

5. A thermocouple assembly comprising:
   a) a ribbon including:
      i. a pair of flat conductors constructed from a pair of dissimilar alloys, wherein the conductors are flat throughout their entire length, thereby minimizing an overall thickness of the thermocouple ribbon;
      ii. an upper layer of polyimide film laminating the pair of flat conductors; and
      iii) a lower layer of polyimide film laminating the pair of flat conductors,
   the upper layer and the lower layer of polyimide film each comprising a layer of polyimide and a layer of fluoropolymer, wherein the upper layer and the lower layer of polyimide film provide a vacuum seal integrity along the entire length of the thermocouple ribbon, wherein each layer of fluoropolymer is 2 mils thick in both the upper layer and the lower layer of polyimide film,
   wherein the vacuum seal integrity is created by heating the upper layer and the lower layer of the polyimide film to increase the temperature of each of the layers of fluoropolymer to a melting point of the fluoropolymer, and upon cooling, the layers of fluoropolymer solidify and bond the thermocouple ribbon together;
   b) a thermocouple connector attached to a first end of the ribbon,
   wherein the conductors are approximately 4 mils thick and further wherein the overall thickness of the thermocouple ribbon is approximately 12 mils.

6. The thermocouple assembly of claim 5 further comprising a welded thermocouple junction at a second end of the ribbon.

7. The thermocouple assembly of claim 5 wherein the fluoropolymer is fluorinated ethylene propylene.

8. The thermocouple assembly of claim 7 wherein each layer of polyimide is approximately 2 mils thick.

9. The thermocouple assembly of claim 5 wherein a width of the thermocouple ribbon is approximately 0.25 inches or less.

* * * * *